US005801587A

United States Patent [19]
Bray

[11] Patent Number: 5,801,587
[45] Date of Patent: Sep. 1, 1998

[54] VARIABLE GAIN PEAK DETECTOR

[75] Inventor: Derek Bray, Los Altos, Calif.

[73] Assignee: Exar Corporation, Fremont, Calif.

[21] Appl. No.: 730,841

[22] Filed: Sep. 26, 1996

[51] Int. Cl.$^6$ .................................................. H03G 3/30
[52] U.S. Cl. ........................................ 330/279; 327/59
[58] Field of Search ...................... 327/58, 59; 330/257, 330/279; 381/106

[56] References Cited

U.S. PATENT DOCUMENTS 5,546,027  8/1996  Shinozaki et al. ..................... 327/59

OTHER PUBLICATIONS

Exar Corporation, product information, Sep. 1996, XR-1072—BBE Sound Enhancement Audio Processor
Exar Corporation, product information, Aug. 1995, XR-1071—BBE II High Defintion Audio Processor.

*Primary Examiner*—Steven J. Mottola
*Attorney, Agent, or Firm*—Loeb & Loeb LLP

[57] ABSTRACT

An improved peak detector for an audio limiter is disclosed where the audio limiter comprises preferably a voltage controlled amplifier and the feedback detector in a feedback arrangement. The peak detector has a resistive capacitive load and either charges or discharges more rapidly when the difference between the output of the peak detector and the output of the voltage controlled amplifier increases. As a result, over much of the range of operation of that difference, the charging or discharging current is linear with the output of the amplifier to provide a constant transconductance gain. However, when the difference exceeds a predetermined maximum, the circuit limits that current, thereby, decreasing the transconductance gain of the circuit.

9 Claims, 3 Drawing Sheets

VARIABLE GAIN PEAK DETECTOR

BACKGROUND OF THE INVENTION

1. Area of the Art

This invention relates to peak detectors and in particular relates to peak detectors having variable gain control for voltage control amplifiers.

2. Description of the Prior Art

FIG. 1 shows a typical prior art configuration of an amplitude limiting circuit 1 commonly used in audio circuits. A voltage controlled amplifier (VCA) 2 receives an input signal from an audio source such as a CD player or a DAT tape (not shown). The voltage controlled amplifier has a variable gain depending upon a control voltage supplied at a control node 4. The output 8 of the VCA 2 is provided to a peak detector 9 that detects the peak output level of the VCA 2 using an external resistive capacitive load $R_L$, $C_L$. If the output of the VCA increases dramatically such as with a loud passage of music, the output voltage 6 from the peak detector changes. As the output voltage of a peak detector changes, it provides a control voltage at the control node 4 of the VCA 2, which lowers the gain of the VCA 2.

Typical prior art peak detectors are fabricated on an integrated circuit, have a fixed transconductance gain, and include an external load resistor $R_L$ and an external load capacitor $C_L$ that stores a rectified voltage to provide the control voltage. Often, the detector compares the output of the amplifier 8 with the rectified voltage $V_L$ across the resistive capacitive load. These external components of the load set, at least in part, a number of the characteristics of the peak detector. For typical audio limiting applications, such circuits must have a fast response time for large amplitude signals on the order of about 100 μsec but preferably have a slow release or decay time. However, for small signal differentials, the attack time should be slow to avoid undesirable audio effects. Typical release times are on the order of ten or more milliseconds.

To meet such criteria, limiting functions have used peak detectors with fixed gain such as those which achieve a fast attack time of 100 μsec for a 1 volt signal requires a transconductance gain of 10 mA/volt for a 1 μF capacitor. With a 1MΩ resistor this means a DC (open loop) gain of 10,000 for a fixed gain detector.

It is readily apparent in such circuits that there is feedback with the system components and again described above providing a unity gain frequency of approximately 160 KHz. Other circuits in the control loop will contribute significant phase shifts that can easily make the system unstable or produce significant ringing in the output signal in response to transient phenomena.

Therefore, it is a first object of this invention to provide a peak detector with a fast attack time and slow release time without any of the disadvantages of the prior art. For small signal differentials, the attack time should also be slow. A second object of this invention is to provide a circuit with a low DC gain and a low unity gain frequency so that ringing is substantially eliminated. It is a third object of the invention to lower the unity gain frequency of approximate 600 Hz.

SUMMARY OF THE INVENTION

These and other objects are achieved by the disclosed embodiments of the invention. Preferably, a variable gain peak detector is used that has a relatively small transconductance on the order of 30 μA/v for open loop gain for small signal differentials between the rectified voltage across the load and the output of the amplifier. For large input signals, the transconductance gain increases dramatically to on the order of 4 mA/v (i.e., at least two orders of magnitude). To limit the attack time, however, the circuit also includes a fall off in transconductance gain at extremely large input differential signals. In addition, the circuit has a relatively low frequency unity gain of about 500–600 Hz to minimize ringing caused by phase distortion from other components in the circuit.

To achieve these aims, the peak detector comprises a differential amplifier with a balanced load to compare the amplifier output with the rectified voltage. For small signal differentials (i.e., less than 100 mV), the amplifier provides negligible output current. For larger differentials, the current increases linearly. The differential amplifier drives a current mirror circuit comprised of a diode connected transistor and a current mirror transistor acting as a common emitter amplifier. The transistors in the current mirror have different emitter resistances and different emitter areas with the mirroring transistor being designed to discharge the capacitive load, which is also coupled to an input of the amplifier. By appropriate selection of the emitter resistances, the discharge current in the mirror transistor can be dramatically increased for large differentials to provide an increased transconductance gain. Still further, an additional transistor may be provided to limit the attack time and to avoid ringing for extremely large differentials of greater than four volts.

DETAILED DESCRIPTION OF THE INVENTION

Figure 1:
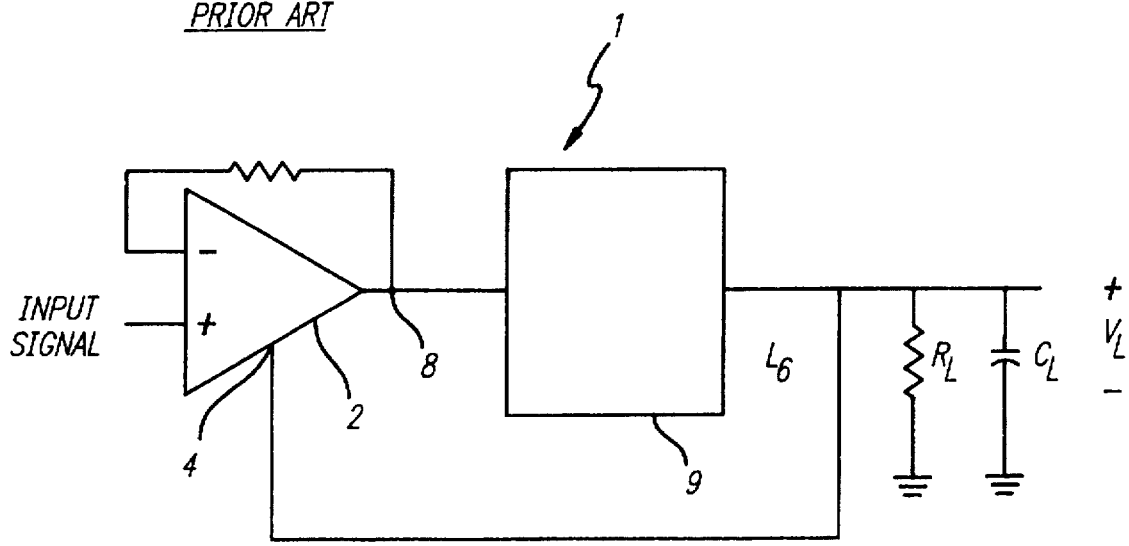
FIG. 1 shows a block diagram of a prior art circuit useful in which the present invention may be used.
Figure 2:
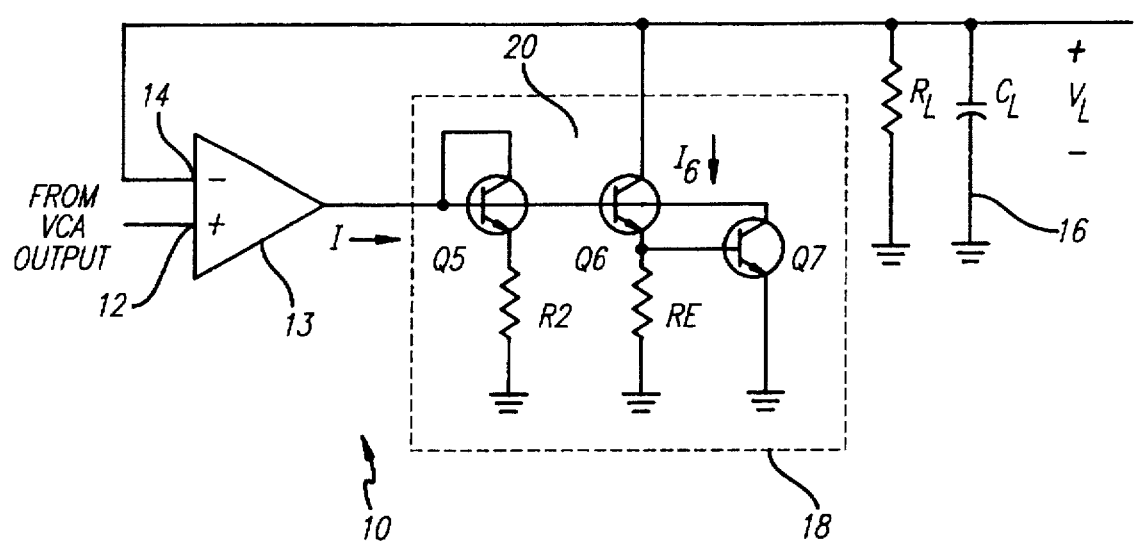
FIG. 2 shows a block diagram for a circuit according to the present invention.

FIG. 2 is a block diagram of an embodiment 10 of the invention. The non-inverting input 12 of a amplifier 13 comprising the input circuit is coupled to the output of the voltage controlled amplifier such as those shown in FIG. 1 and the inverting input 14 of the amplifier is coupled to the control node of the voltage control amplifier (not shown) and to the resistive capacitive load 16 of the peak detector. The output circuit 18 of the detector 10 comprises a current mirror 20 comprised of transistors Q5 and Q6 with different emitter resistances R2 and RE and different emitter areas. An optional current transistor Q7 may also be provided.

The amplifier 13 provides essentially a minimal current output when the input and output voltages are approximately equal (i.e., where the peak output of the VCA is approximately equal to the rectified voltage $V_L$). When the differential voltage becomes more negative, such as from the voltage signal of a sudden sound such as a cymbal clash, the current output I of the amplifier 13 increases linearly. That current output I drives the diode connected transistor Q5 and the common emitter amplifier transistor Q6, thereby causing an increased voltage drop across resistor R2. This increases the base emitter voltage of transistor Q6, thereby causing the transistor Q6 to sink more current $I_6$ than in the quiescent state (i.e., when the input and output voltages are substantially equal). As $I_6$ starts to flow, it discharges the capacitor $C_L$, so that the differential between the peaks at the input and the rectified output voltage at the load $V_L$ decreases. The resistance of resistor RE is selected so that when the discharge current through transistor Q6 increases beyond a predetermined limit, the base emitter voltage of transistor Q7, it is sufficient to turn on transistor Q7, thereby diverting the drive current of transistor Q5. This limits the voltage drop across transistor R2 and therefore limits the maximum current 18 through transistor Q6.

For example with R2 at 5KΩ, resistor RE would be about 50Ω, assuming that the transistors are of equal size. This results in an overall voltage/current transfer curve shown in FIG. 4, where the abscissa represents the negative peak input/rectified output voltage difference of the peak detector and the ordinate represents the output (discharge) current $I_6$. For voltage differences less than~100 mV, the output current is negligible because the drive current I is negligible. As the drive current I increases and becomes linear with the differential of the negative peak and the rectified voltage $V_L$, the current $I_6$ increases at first exponentially and then linearly as transistor Q6 turns on.

Figure 3:
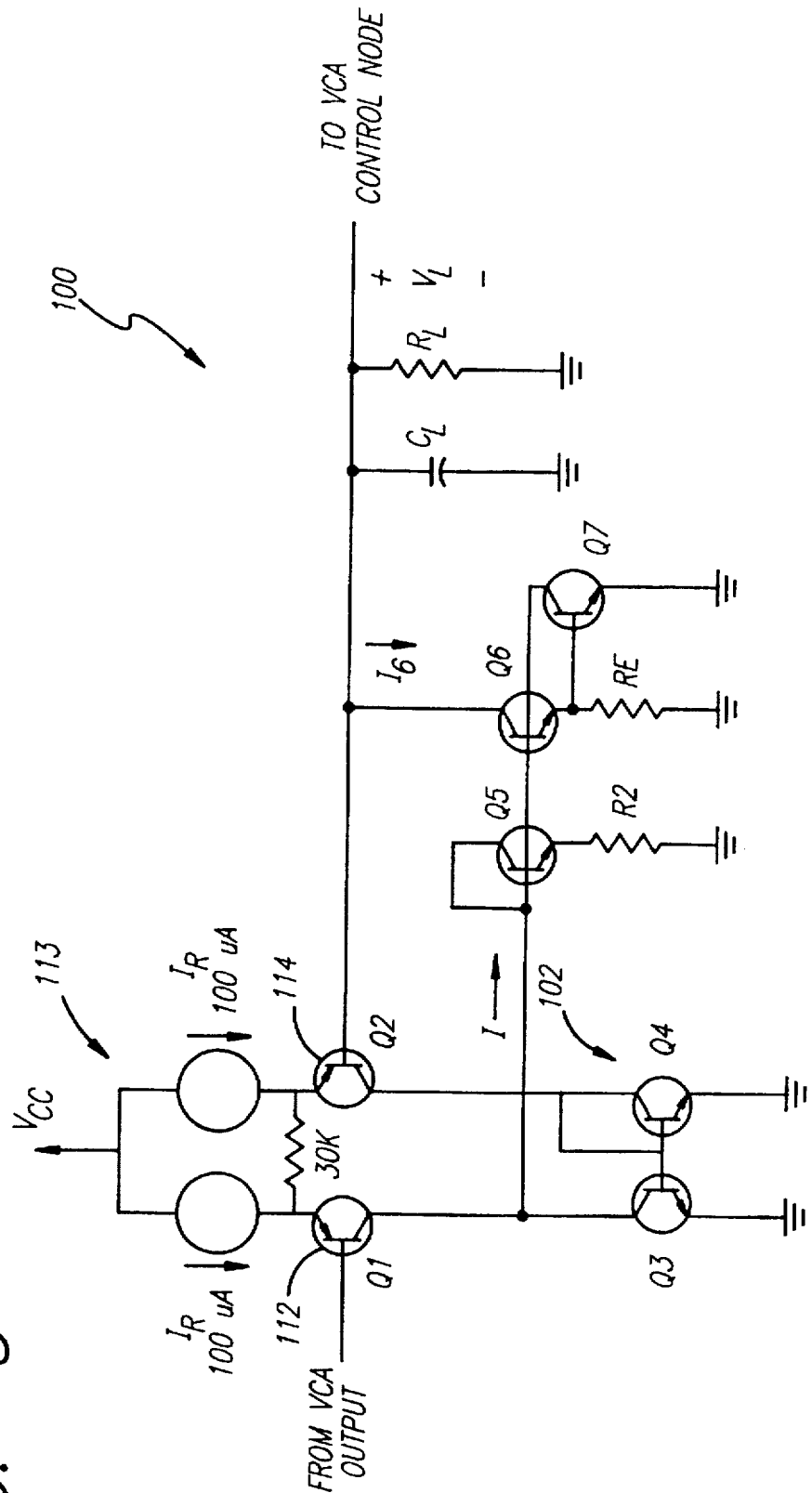
FIG. 3 is a detailed schematic of a circuit according to the present invention.
Figure 4:
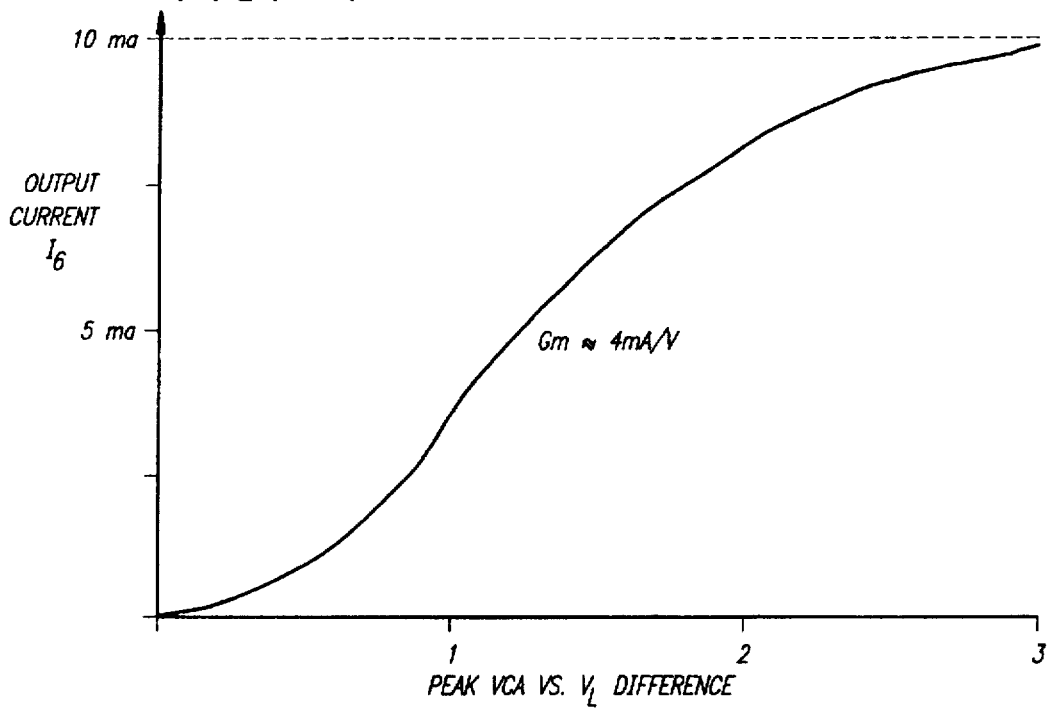
FIG. 4 is a chart of the voltage/current characteristics of the circuit.

FIG. 3 shows a further embodiment 100 of the invention with like components bearing like numbers. The amplifier 113 comprises identical current sources IR of 100 µA, resistor R1 of 30KΩ, PNP transistors Q1 and Q2 and a balanced load comprised of NPN transistors Q3 and Q4. Preferably transistor pairs Q1 and Q2 and transistor pair Q3 and Q4 having substantially equal dimensions. In the quiescent state for low level differential input signals of for example less than~100 mV between the negative peak of the VCA output and the rectified output voltage $V_L$, the current through transistors Q3 and Q4 are substantially equal. Therefore, the output current I of the amplifier 112 is low, so that current through transistor Q5 remains relatively low. This means that the voltage drop across resistor R2 is relatively low, so that the discharge current from transistor Q6 remains low, for example, less than about 200 µA. As the input voltage excursions at the base of transistor Q1 are displaced more negatively from the voltage across the load, transistor Q1 conducts more current than transistor Q2. Since the load of the amplifier 112 is balanced, the excess current I is supplied as additional drive current to diode coupled transistor Q5. This causes the voltage drop across R2 to increase, thereby causing transistor Q6 to turn on harder, thereby sinking more current $I_6$ from the capacitor and lowering the output load voltage $V_L$. As transistor Q6 starts to turn on, the current $I_6$ starts to increase exponentially. For example, as the negative differential excursions exceed one volt, the discharge current will exceed 5 mA. In this embodiment, as can be seen in FIG. 4, the current $I_6$ is substantially linear with respect to the difference between the negative peak voltage and Q6 is operating in its linear range. When transistor Q6 is operating linearly, the peak detector has a substantially constant transconductance gain for the embodiment 100 up to a predetermined limit. As the current through emitter resistor RE of transistor Q6 exceeds 10 mA (at about a 2.5 V differential), the voltage drop across RE starts to cause transistor Q7 to conduct, diverting drive current from both transistors Q5 and Q6, and thereby limiting the sinking current $I_6$ to avoid ringing.

Figure 5:
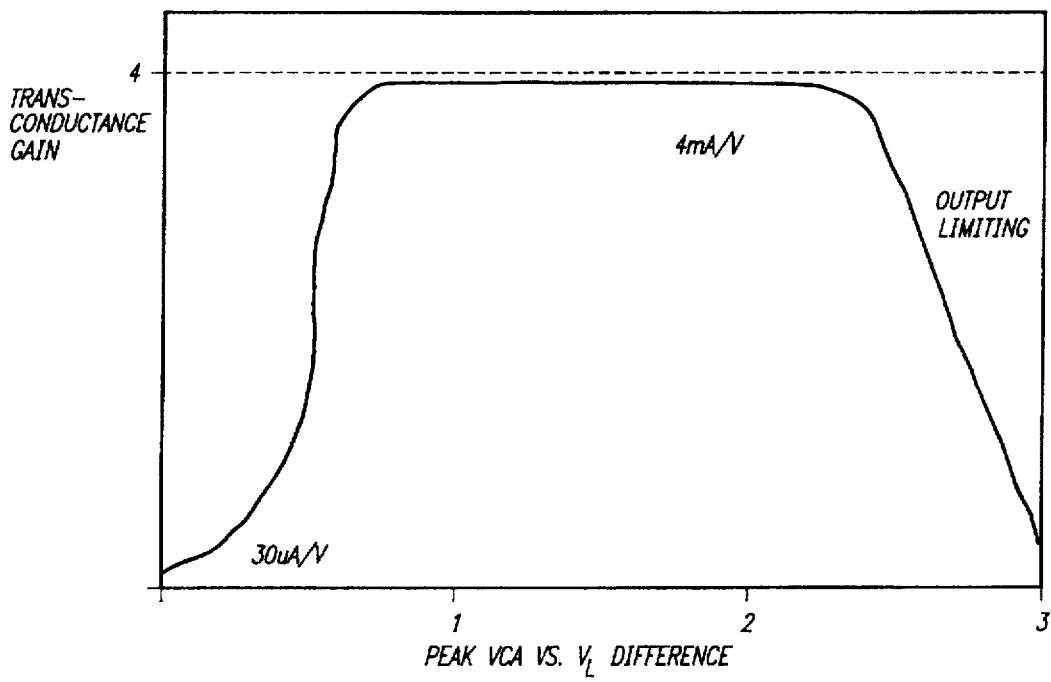
FIG. 5 is a chart of the transconductance gain of the circuit over the operational voltage differences.

As a result of transistor Q6 and Q7 being turned on hard at different output currents from the input stage amplifier 13, the circuit has a transconductance gain curve of the type shown in FIG. 5. At low differential voltages between the negative peak input and the rectified output voltage, the current $I_6$ sunk by transistor Q6 is low so that the transconductance gain of the circuit is low, for example 30 uA/V. This is a result of current I being close to zero, so that transistor Q6 conducts minimal current. As transistor Q6 starts to increase its conduction exponentially, the transconductance gain starts to increase exponentially. As transistor Q6 turns on more, due to increased differential voltage represented by the ordinate, the current of the transistor Q6 increases so that the transconductance gain of the circuit becomes constant with the increasing voltage differential as shown in FIG. 3. This transconductance gain is substantially higher than the transconductance gain of the amplifier to small differential inputs, for example, a peak of 4 mA/V. Thus, the peak detector gain increases about two orders of magnitude. The transconductance gain becomes constant as current I becomes linear and transistor Q6 is operating in the linear range. When transistor Q7 starts to turn on at a differential of about 2.5 volts, thereby diverting drive current from transistor Q5 and its mirrored transistor Q6 so that the transconductance gain starts to drop back towards zero as transistor Q7 draws the increase in the current I.

As a result of the increased transconductance gain up to 2.5 volts, the load capacitor $C_L$ is discharged more quickly, thereby providing a faster attack response time of the circuit to larger differentials where limiting of the gain of the VCA is needed. However, to avoid ringing for very large differential inputs, transistor Q7 attenuates the transconductance gain of the circuit and thereby limits the attack time response. Still further, the release time of the circuit remains determined largely by the external resistor and capacitor's time constant so that the release time of the circuit is relatively slow.

Although a number of embodiments of the present invention have been described, it will be understood that various modifications may be made without departing from the spirit and scope of the invention. For example, those of ordinary skill in the field will recognize that the specific embodiments of the circuit may be readily modified. For example, the circuit could be readily modified to replace the bipolar transistors with MOSFETS. Further, rather than sinking current from load capacitor, the circuit could also source current into the load capacitor and rather than detecting negative peaks, positive peaks or positive peaks and negative peaks could be detected. In addition, rather than using currents to control the operation of the circuit, the circuit could be controlled with voltages. Still further transistor Q7 is optional and may be omitted. In addition, the specific ranges of the voltage differentials and transconductance gains and the thresholds may be adjusted as need be by changing the resistors and transistor dimensions. Still further, the entire circuit may be fabricated on an integrated circuit and any of R2, RE, RL, and CL may be optionally external components to permit user selection of the difference ranges of the varying gain and the attack and release times along with the unity gain frequency. Accordingly, it is to be understood that the invention is not to be limited by the specific illustrated embodiment, but only by the scope of the appended claims.

I claim:

1. In an audio limiting circuit for an input audio signal, the audio limiting circuit comprising a controllable gain controlled amplifier having a control node to control the gain of the amplifier responsive to a signal at the control node and response to the input audio signal and outputting a gain controlled version of the audio input signal, and a peak detector responsive to the gain controlled version of the audio input signal to determine the peak of the gain controlled version of the audio signal with a resistive capacitive load, the peak detector being coupled to the control node of the gain controlled amplifier such that the controllable gain controlled amplifier performs an audio limiting function, wherein the improvement comprises:

the transconductance gain of the peak detector varies non-linearly over a range of differences proportional to the difference of the signal at the control node and the gain controlled version of the audio signal; and the peak detector includes circuitry providing a signal that varies substantially linearly with the difference and includes circuitry that sources or sinks current to the load proportional to the differences for differences greater than a first threshold and less than a second threshold.

2. The audio limiting circuit of claim 1, wherein the current has a magnitude and for differences greater than the second threshold, the magnitude of the current is limited with the differences, whereby the attack time of the limiting circuit is limited.

3. A peak detector detecting at least one of the positive or negative peaks about a level at an input to produce an output rectified voltage, the peak detector comprising:

difference circuitry responsive to the difference between the detected peaks and the rectified voltage; and an amplifier having a variable transconductance gain variably responsive to the difference of the detected difference, wherein for negligible detected differences the transconductance gain is a first magnitude and for larger magnitude detected differences, the transconductance gain is about two orders of magnitude greater, the amplifier comprising a current mirror driven by the output difference having two transistors, the two transistors having different emitter resistances so that the transconductance gain of the amplifier increases at least one order of magnitude with the difference current.

4. The peak detector of claim 3 wherein a third transistor diverts current from the mirror to reduce the transconductance current.

5. A peak detector detecting at least one of the positive or negative peaks about a level at an input to produce an output rectified voltage, the peak detector comprising:

difference circuitry responsive to the difference between the detected peaks and the rectified voltage to produce a difference current; and an amplifier having a variable transconductance gain variably responsive to the difference current and including first and second transistors coupled to receive the difference current, the first transistor being coupled to conduct the difference current therethrough and through a first resistor coupled thereto, and the second transistor being coupled to conduct a second current therethrough and through a second resistor coupled thereto, the amplifier biasing the first and second transistors so that the second current is substantially equal to the difference current for relatively small differences and so that the second current is substantially larger than the difference current for relatively large differences.

6. The peak detector of claim 5, wherein the difference current is provided by a lead to base terminals of the first and second transistors, the first transistor has a collector terminal coupled to the base terminal thereof and an emitter terminal coupled to the first resistor, and the second transistor has a collector terminal, an emitter terminal coupled to the second resistor, and the second current flows through the collector and emitter terminals of the second transistor and through the second resistor.

7. The peak detector of claim 6, wherein the second resistor is of relatively small value so that the second current can be relatively large for a given level of bias of the second transistor.

8. The peak detector of claim 5, further including a third transistor coupled to the second transistor for limiting the second current.

9. The peak detector of claim 8, wherein the third transistor has a collector terminal coupled to a base terminal of the second transistor and a base terminal coupled to emitter terminal of the second transistor.

* * * * *